(12) United States Patent
Chang et al.

(10) Patent No.: US 7,388,265 B2
(45) Date of Patent: Jun. 17, 2008

(54) THIN FILM TRANSISTOR AND FABRICATION METHOD THEREOF

(75) Inventors: Shih-Chang Chang, Hsinchu (TW); De-Hua Deng, Ba-De (TW); Chun-Hsiang Fang, Yilan Hsien (TW); Yaw-Ming Tsai, Taichung Hsien (TW)

(73) Assignee: TFO Displays Corp., Chu-Nan (TW)

( * ) Notice: Subject to any disclaimer, the term of this patent is extended or adjusted under 35 U.S.C. 154(b) by 0 days.

(21) Appl. No.: 11/598,844

(22) Filed: Nov. 13, 2006

(65) Prior Publication Data

US 2007/0057332 A1   Mar. 15, 2007

Related U.S. Application Data

(60) Division of application No. 10/850,980, filed on May 20, 2004, now Pat. No. 7,145,209, which is a continuation-in-part of application No. 10/833,487, filed on Apr. 27, 2004, now Pat. No. 7,238,963.

(30) Foreign Application Priority Data

May 20, 2003   (TW) ............... 92113534 A
May 20, 2003   (TW) ............... 92113535 A

(51) Int. Cl.
   *H01L 29/76*   (2006.01)
(52) U.S. Cl. ............... 257/408; 257/59; 257/E29.151; 257/E29.137; 257/E29.273
(58) Field of Classification Search ............... 257/408, 257/E29.151
   See application file for complete search history.

(56) References Cited

U.S. PATENT DOCUMENTS

| 5,292,675 A | 3/1994 | Codama |
| 6,034,748 A * | 3/2000 | Furuta ............... 349/43 |
| 6,108,056 A | 8/2000 | Nakajima et al. |
| 6,114,715 A | 9/2000 | Hamada |
| 6,130,119 A | 10/2000 | Jinnai |
| 2002/0025591 A1* | 2/2002 | Ohnuma et al. ............... 438/30 |
| 2002/0041350 A1 | 4/2002 | Yamazaki et al. |
| 2002/0117736 A1 | 8/2002 | Yamazaki et al. |
| 2002/0119606 A1 | 8/2002 | Hamada et al. |

(Continued)

FOREIGN PATENT DOCUMENTS

JP    05-047791    2/1993

(Continued)

*Primary Examiner*—Tu-Tu V Ho
(74) *Attorney, Agent, or Firm*—Liu & Liu

(57) ABSTRACT

A thin film transistor (TFT) with a self-aligned lightly-doped region and a fabrication method thereof. An active layer has a channel region, a first doped region and a second doped region, in which the first doped region is disposed between the channel region and the second doped region. A gate insulating layer formed overlying the active layer has a central region, a shielding region and an extending region. The shielding region is disposed between the central region and the extending region, the central region covers the channel region, the shielding region covers the first doped region, and the extending region covers the second doped region. The shielding region is thicker than the extending region. A gate layer is formed overlying the gate insulating layer, covers the central region and exposes the shielding region and the extending region.

18 Claims, 15 Drawing Sheets

U.S. PATENT DOCUMENTS

| | | |
|---|---|---|
| 2002/0134979 A1 | 9/2002 | Yamazaki et al. |
| 2003/0025127 A1 | 2/2003 | Yanai et al. |
| 2003/0067004 A1 | 4/2003 | Nakazawa et al. |
| 2004/0051142 A1 | 3/2004 | Yamazaki et al. |
| 2005/0237286 A1 | 10/2005 | Tanada |

FOREIGN PATENT DOCUMENTS

| | | |
|---|---|---|
| JP | 06-140421 | 5/1994 |
| JP | 06-333948 | 12/1994 |
| JP | 07-211912 | 8/1995 |
| JP | 2003-023014 | 1/2003 |

* cited by examiner

THIN FILM TRANSISTOR AND FABRICATION METHOD THEREOF

This is a Divisional of U.S. patent application Ser. No. 10/850,980, filed May 20, 2004, now Pat. No. 7,145,209, which is a continuation-in-part of U.S. Utility patent application Ser. No. 10/833,487, filed Apr. 27, 2004, now Pat. No. 7,238,963, which is commonly assigned to the assignee of the present invention, and which is incorporated by reference herein as if fully set forth herein.

BACKGROUND OF THE INVENTION

1. Field of the Invention

The invention relates to a thin film transistor (TFT), and more particularly to a thin film transistor with a self-aligned lightly-doped region and a fabrication method thereof.

2. Description of the Related Art

Thin film transistors (TFTs) are used in a variety of integrated circuits, and in particular, as a switching device in each pixel area of liquid crystal display (LCD) and OLED display. According to the materials used, a TFT is classified as either an amorphous silicon TFT or a polysilicon TFT. Compared with the amorphous TFT, the polysilicon TFT has the advantages of high carrier mobility, high integration of driving circuits, small leakage current and higher speed operation, and is often applied to high-speed operation applications, such as a static random access memory (SRAM). One of the major problems of these TFTs is the OFF-state leakage current, which causes charge loss in LCDs and high standby power dissipation in SRAMs. Seeking to solve this problem, conventional lightly doped regions have been used to reduce the drain junction field, thereby reducing the leakage current.

FIGS. 1A and 1B are cross-sectional diagrams showing a conventional method of forming a lightly doped region on a poly-Si TFT.

In FIG. 1A, a polysilicon layer 12 is formed on a predetermined surface of a transparent insulating substrate 10, and then a gate insulating layer 14 is formed on the polysilicon layer 12. Next, using a patterned photoresist layer 16 as a mask, a heavy ion implantation process 17 is performed to form an $N^+$ doped region 18 on the polysilicon layer 12, thus serving as a source/drain region.

In FIG. 1B, after removing the patterned photoresist layer 16, a gate layer 20 is patterned on the gate insulating layer 14 to cover a part of the undoped regions of the polysilicon layer 12. Next, using the gate layer 20 as a mask, a light ion implantation process 21 is performed to form an $N^-$ doped region 22 on the undoped region of the polysilicon layer 12. The $N^-$ doped region 22 serves as a lightly doped region, and the undoped region of the polysilicon layer 12 underlying the gate layer 20 serves as a channel region.

The above-described method uses the patterned photoresist layer 16 to define the source/drain region, and uses the gate layer 20 to define the lightly doped region. With regard to the limitations of the exposure technique, a problem of photo misalignment easily occurs and may lead to a shift of the gate layer 20, resulting in a shift of the lightly doped region. Also, since two steps of ion implantation processes 17 and 21 are required, the shift problem is worsened, and the complexity of the process, the production cost, and the process time are increased. Moreover, the length of the channel region may vary due to shifting of the lightly doped region, thus the scale reducibility of the polysilicon TFT and the electric performance of the channel region are not reliable.

FIGS. 2A to 2C are cross-sectional diagrams showing another conventional method of forming a lightly doped region structure on a poly-Si TFT. In FIG. 2A, a polysilicon layer 32, a gate insulating layer 34 and a gate layer 36 are successively formed on a transparent insulating substrate 30. Then, using a first photoresist layer 38 as a mask, the gate layer 36 and the gate insulating layer 34 are etched to expose a predetermined region of the polysilicon layer 32.

Hereinafter, the method of forming the LDD (lightly doped drain) structure is used in N-MOS poly-Si TFT applications. In FIG. 2B, after removing the first photoresist layer 38, the gate layer 20 is used as a mask, and a light ion implantation process 39 is performed to form an $N^-$ doped region 40 on the exposed region of the polysilicon layer 32.

Next, in FIG. 2C, a second photoresist layer 42 is formed to cover the top and the sidewall of the gate layer 36 and the gate insulating layer 34, thus covering a portion of the N– doped region 40 laterally adjacent to the gate layer 36. Finally, using the second photoresist layer 42 as a mask, a heavy ion implantation process 43 is performed to form an $N^+$ doped region 44 on the exposed area of the $N^-$ doped region 40. Thus, the $N^+$ doped region 44 serves as a source/drain region, the remaining portion of the N– doped region 40 serves as an LDD structure, and the polysilicon layer 32 underlying the gate layer 36 serves as a channel region.

The above-described method prevents the shift of the LDD structure from the shift of the gate layer 36 caused by the photo misalignment. The shift of the second photoresist layer 42 and two steps of the ion implantation processes 39 and 43, however, still worsen the shift problem of the LDD structure.

SUMMARY OF THE INVENTION

The present invention provides a process of forming a semiconductor device, which comprises heavily doped and lightly doped regions in a semiconductor layer formed in a single doping operation. This is accomplished by providing a doping mask having a relatively thicker section that corresponds to a region to be lightly doped, and a relatively thinner section to be heavily doped.

In one aspect of the present invention, a doping mask has a thicker section that covers the region of the semiconductor layer to be lightly doped and a thinner section that covers the region of the semiconductor layer to be heavily doped during the doping process. The doping mask is permeable to dopant, but provides a barrier to the dopant such that the thinly covered region is heavily doped compared to the thickly covered region. The relative thickness of the two sections of mask is chosen in relation to the doping parameters (e.g., time, dopant, concentration, etc.) to result in the desired doping levels in the lightly doped region and the heavily doped region in a single doping operation.

In another aspect of present invention, more than one layer of mask may be provided to form the relatively thicker section.

Accordingly, the invention provides in another embodiment a thin film transistor with a self-aligned lightly doped region, in which a thickness of a gate insulating layer over a lightly doped region is larger than that over a source/drain region, thus one step of ion implantation can achieve the lightly doped region and the source/drain region at the same time.

According to one embodiment of the invention, a thin film transistor comprises an active layer comprising a channel region, a first doped region and a second doped region, in which the first doped region is disposed between the channel region and the second doped region. A gate insulating layer is formed overlying the active layer and comprises a central region, a shielding region and an extending region. The shielding region is disposed between the central region and the extending region, the central region covers the channel region, and the shielding region covers the first doped region, and the extending region covers the second doped region. The thickness of the shielding region is larger than the thickness of the extending region. A gate layer is formed overlying the gate insulating layer, in which the gate layer covers the central region and exposes the shielding region and the extending region.

According to another embodiment of the invention, a fabrication method includes the following steps. An active layer is formed overlying a substrate, and then a gate insulating layer is formed overlying the active layer. The gate insulating layer comprises a central region, a shielding region and an extending region, and the shielding region is disposed between the central region and the extending region. Next, a gate layer is formed overlying the gate insulating layer, in which the gate layer covers the central region and exposes the shielding region and the extending region. Next, using an etching process for patterning the gate layer, the gate layer covers the central region and exposes the shielding region and the extending region. Also, the thickness of the shielding region is larger than the thickness of the extending region. Finally, using an ion implantation process, a first doped region and a second doped region are formed in the active layer. The first doped region is covered by the shielding region, and the second doped region is covered by the extending region.

Furthermore, according to still another embodiment of the invention, a thin film transistor comprises an active layer, a first gate insulating layer and a second gate insulating layer overlying the active layer, a first gate layer overlying the first gate insulating layer, and a second gate layer overlying the second gate insulating layer. The active layer comprises a first lightly doped region, a second lightly doped region, a third lightly doped region, a first channel region, a second channel region, a fourth lightly doped region, a fifth lightly doped region, a first heavily doped region, and a second heavily doped region. The second lightly doped region and the third lightly doped region are formed laterally adjacent to the first lightly doped region respectively. The first channel region and the second channel region extend laterally away from the second lightly doped region and the third lightly doped region respectively. The fourth lightly doped region and the fifth lightly doped region extend laterally away from the first channel region and the second channel region respectively. The first heavily doped region and the second heavily doped region extends laterally away from the fourth lightly doped region and the fifth lightly doped region respectively. The first gate insulating layer and the second gate insulating layer each comprises a central region covering the first channel region of the active layer, a first shielding region covering the fourth lightly doped region of the active layer, a second shielding region covering the second lightly doped region of the active layer, a first extending region covering the first heavily doped region, and a second extending region covering the first lightly doped region. The first gate layer covers the central region of the first gate insulating layer and the second gate layer covers the central region of the second gate insulating layer.

According to yet another embodiment of the invention, a fabrication method for a thin film transistor having a multi-gate structure comprises the following steps. An active layer is formed overlying a substrate. Two gate insulator layers are formed overlying the active layer. Each gate insulating layer comprises a central region, two shielding regions, and two extending regions, and one of the shielding regions is disposed between the central region and one of the first extending regions. One of the two extending regions from each gate insulating layer are adjacent to be a common extending region. A gate layer is formed overlying each gate insulating layer to cover the central region and exposes the shielding regions and the extending regions. An etching process is performed to pattern each gate layer such that each gate layer covers the central region and exposes the shielding regions and the extending regions and the thickness of the shielding region is larger than the thickness of the extending region. A first ion implantation process is performed to form three first heavily doped regions in the active layer correspondingly underlying the extending regions, four first lightly doped regions in the active layer correspondingly underlying the shielding regions, and two undoped regions in the active layer correspondingly underlying the central regions. Then, a photoresist layer is formed to cover part of each gate layer and the two shielding regions and the common extending region between the two gate layers and expose the other two shielding regions and the other two extending regions. A second ion implantation process is performed to form two second heavily doped regions in the active layer underlying the two exposed extending region and two second lightly doped regions in the active layer underlying the two exposed shielding regions.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE ILLUSTRATED EMBODIMENTS

First Embodiment

Figure 1A:
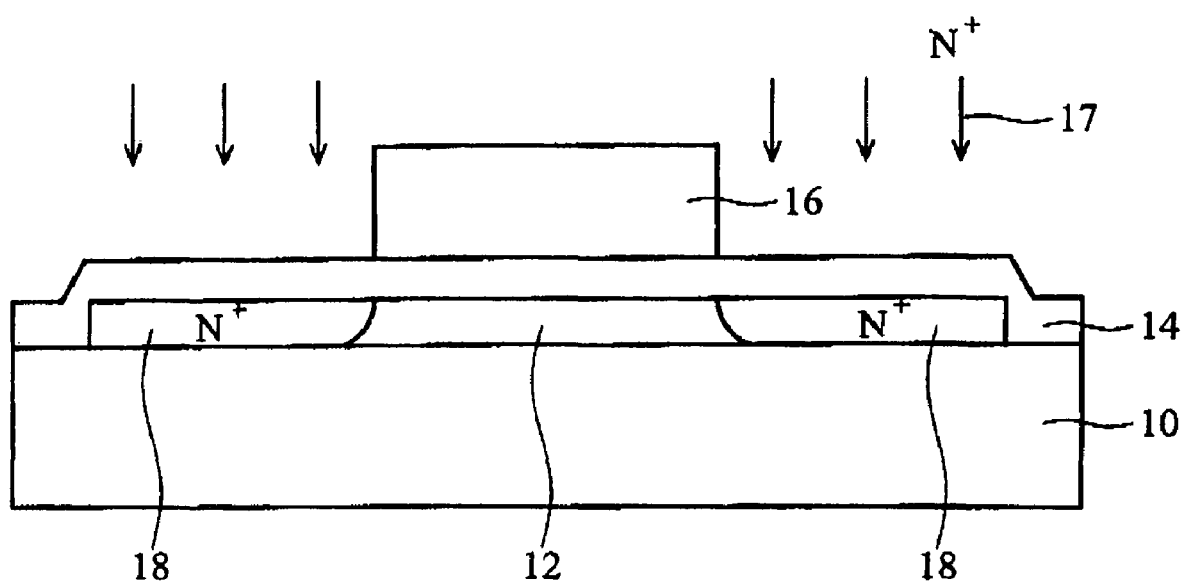
FIGS. 1A and 1B are cross-sectional diagrams showing a conventional method of forming an LDD structure on a poly-Si TFT.
Figure 1B:
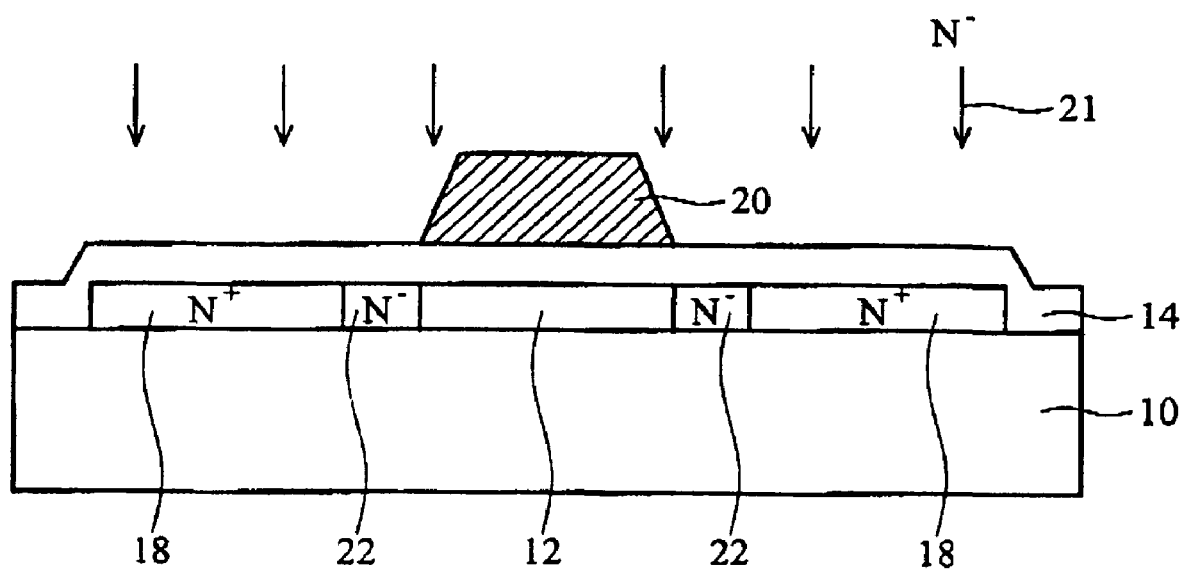
Figure 2A:
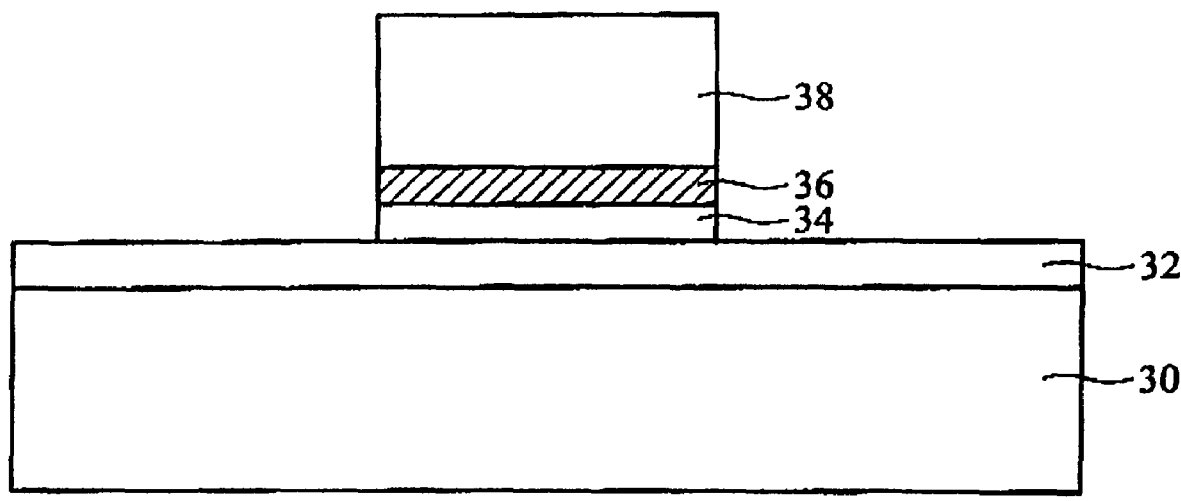
FIGS. 2A to 2C are cross-sectional diagrams showing another conventional method of forming an LDD structure on a poly-Si TFT.
Figure 2B:
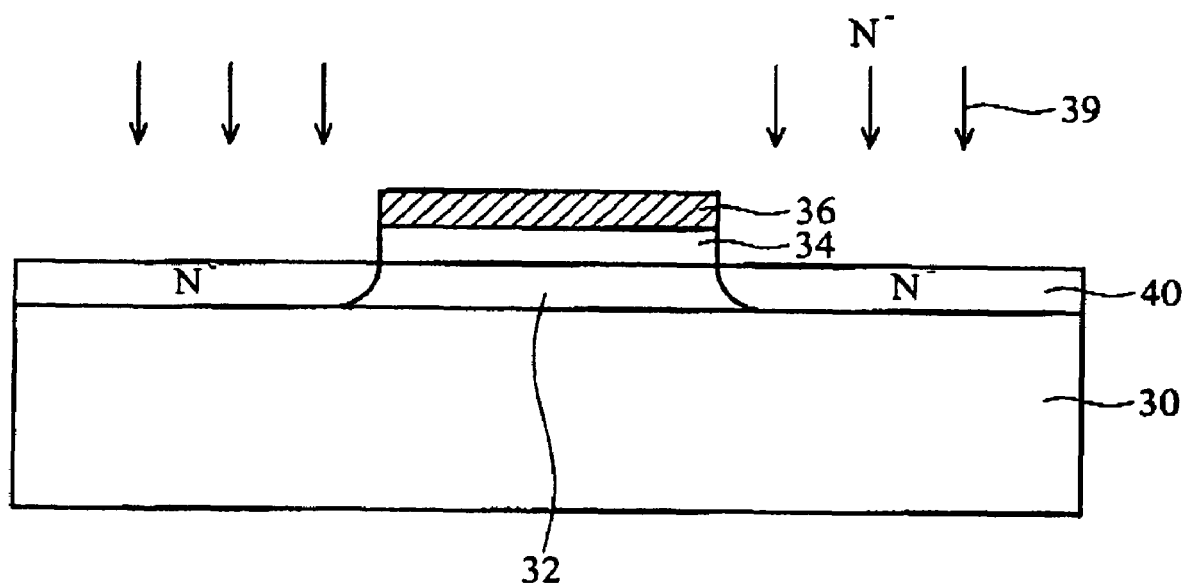
Figure 2C:
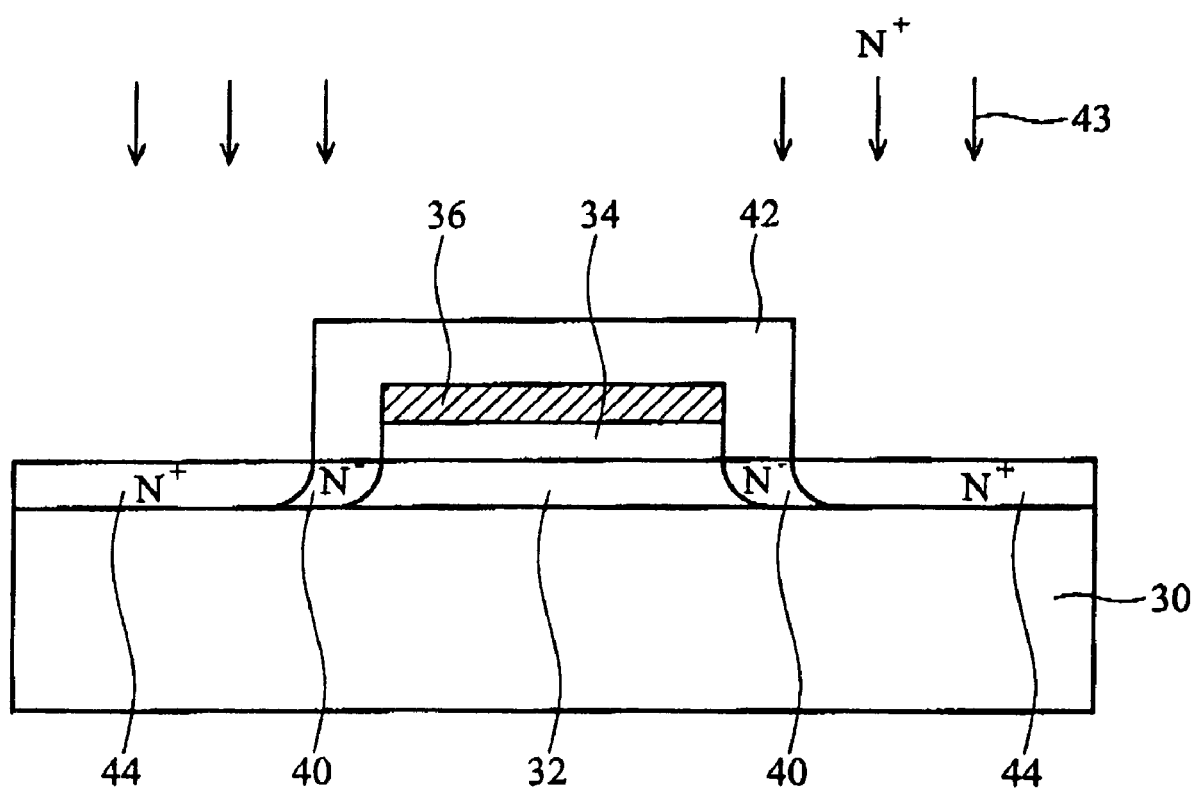
Figure 3:
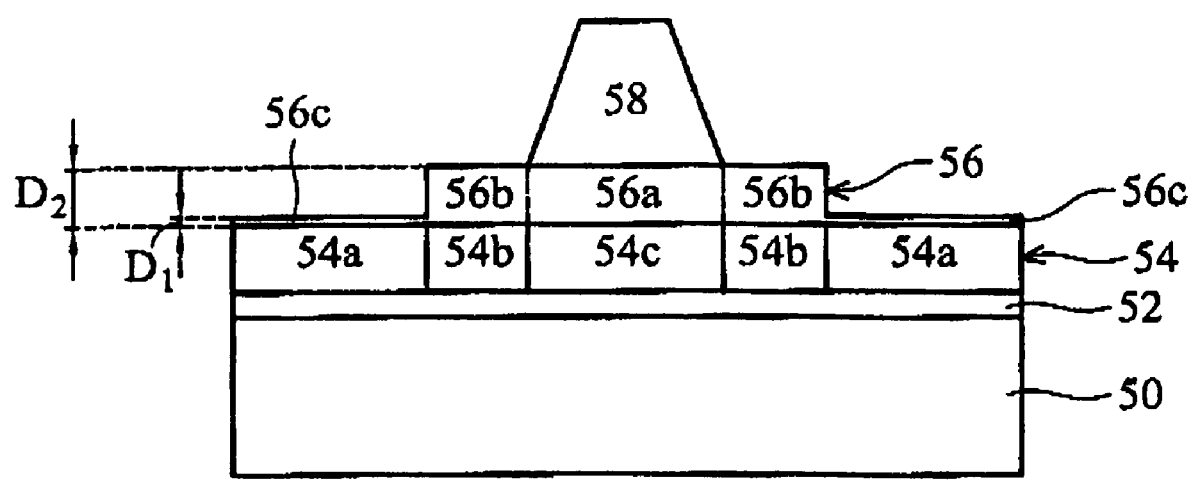
FIG. 3 is a cross-section of a thin film transistor with a self-aligned lightly doped region according to the first embodiment of the present invention.

FIG. 3 is a cross-section of a thin film transistor with a self-aligned lightly doped region according to the first embodiment of the present invention.

A substrate 50 comprises a buffer layer 52, an active layer 54, a gate insulating layer 56 and a gate layer 58 formed successively thereon. The substrate 50 is preferably a transparent insulating substrate, such as a glass substrate. The buffer layer 52 is preferably a dielectric layer, such as a silicon oxide layer, for improving the formation of the active layer 54 overlying the substrate 50. The active layer 54 is preferably a semiconductor layer, such as a polysilicon layer. The gate insulating layer 56 may be a silicon oxide layer, a silicon nitride layer, a SiON layer or a combination thereof. The gate layer 58 is preferably a conductive layer, such as a metal layer or a polysilicon layer.

The gate insulating layer 56 comprises a central region 56a, two shielding regions 56b and two extending region 56c. The central region 56a is covered by the bottom of the gate layer 58. The two shielding regions 56b extend laterally away from the central region 56a, respectively, without being covered by the gate layer 58. The two extending regions 56c extend laterally away from two shielding regions 56b, respectively, without being covered by the gate layer 58. The active layer 54 comprises a channel region 54c, two lightly doped regions 54b and two source/drain regions 54a. The channel region 54c is covered by the central region 56a and corresponds to the bottom of the gate layer 58. The two lightly doped regions 54b extend laterally away from the channel region 54c, and are covered by the two shielding regions 56b, respectively. The two source/drain regions 54a extend laterally away from two lightly doped regions 54b, and are covered by the two extending regions 56c, respectively.

By modulating parameters of the photolithography and etching processes for the formation of the gate layer 58 and the gate insulating layer 56, a thickness $D_1$ of the extending region 56c and a thickness $D_2$ of the shielding region 56b can be effectively controlled to satisfy the condition: $D_1<D_2$. Preferably, the thickness $D_1$ is far smaller than the thickness $D_2$. Alternatively, the thickness $D_1$ is close to a minimum. Thus, using the thicker shielding region 56b as an ion-implantation mask for the lightly doped region 54b, the lightly doped region 54b and the source/drain region 54a can be achieved at the same time by one ion implantation process with adequate doping energy and dosage. Preferably, the shielding region 56b has a lateral width of 0.1~2.0 μm, the lightly doped region 54b has a doping concentration less than $5\times10^{18}$ atom/cm$^3$ serving as an LDD structure, alternatively less than $2\times10^{17}$ atom/cm$^3$ serving as an offset region, and the source/drain region 54a has a doping concentration of $2\times10^{19}$~$2\times10^{21}$ atom/cm$^3$.

The thin film transistor of the first embodiment of the present invention has advantages described below.

First, by adjusting the difference between the thickness $D_1$ of the extending region 56c and the thickness $D_2$ of the shielding region 56b, the thicker shielding region 56b can be used as an ion-implantation mask for the lightly doped region 54b, thus the position of the lightly doped region 54b can be accurately controlled to ensure the electric performance of the thin film transistor.

Second, since an extra photomask for defining the lightly doped region 54b is omitted, a shift problem of the lightly doped region 54b is prevented from the photo misalignment in exposure technique. This can further improve the accuracy in the position of the lightly doped region 54b.

Third, compared with the conventional method, the present invention can reduce one photomask and one step of the ion implantation process, thus simplifying the procedure, decreasing process costs, increasing product yield, increasing production rate. Additionally, the method is highly applicable to mass production.

The thin film transistor is used in N-MOS TFT applications, thus the lightly doped region 54b is an N$^-$-doped region, and the source/drain region 54a is an N$^+$-doped region. Alternatively, the thin film transistor is used in P-MOS TFT applications, thus the lightly doped region 54b is a P$^-$-doped region, and the source/drain region 54a is a P$^+$-doped region. The profile of the gate layer 58 may be square, trapezoid, or another enforceable shape. Alternatively, not shown, the insulating layer 56 may have a gradually thinning or tapering in thickness to provide a gradual change in doping concentration outside of the gate region 56a.

By appropriately defining the relative thickness of the gate insulating layer 56 at regions 56b and 56c, in relation to the doping process parameters (e.g., dopant, doping time, concentration, etc.), the desired relative doping concentrations in the first and second doped areas 54b and 54a may be achieved when they are exposed to the same doping operation, e.g., using the same doping process parameters.

For certain applications, it may be desired to alter the doping process parameters and/or using a different or additional mask during the doping process. For example, after initial doping to form the lightly and heavily doped regions using a particular dopant concentration, a mask may be applied to cover the lightly doped region, to further dope the region to be heavily doped. Such variation is well within the scope and spirit of the present invention.

FIG. 3 is a simplified basic TFT configuration, including a drain, source and a channel. Further steps to complete the may include steps to form, for example, electrodes, metalization, interconnect structures, passivation layers, etc. known in the art.

Second Embodiment

Figure 4A:
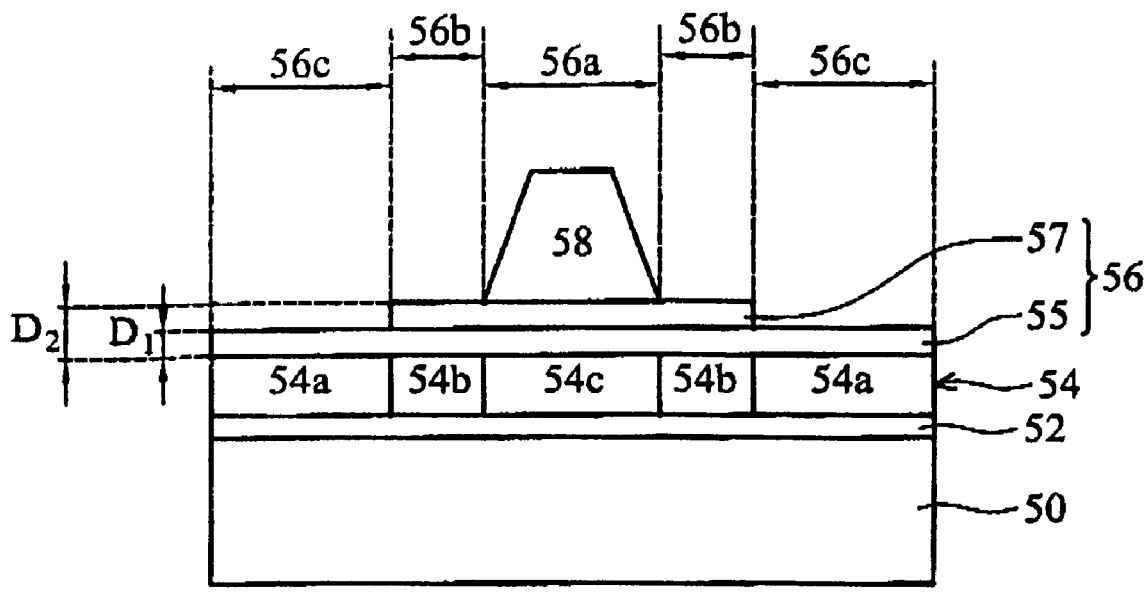
FIGS. 4A and 4B are cross-sections of a thin film transistor with a self-aligned lightly doped region according to the second embodiment of the present invention.
Figure 4B:
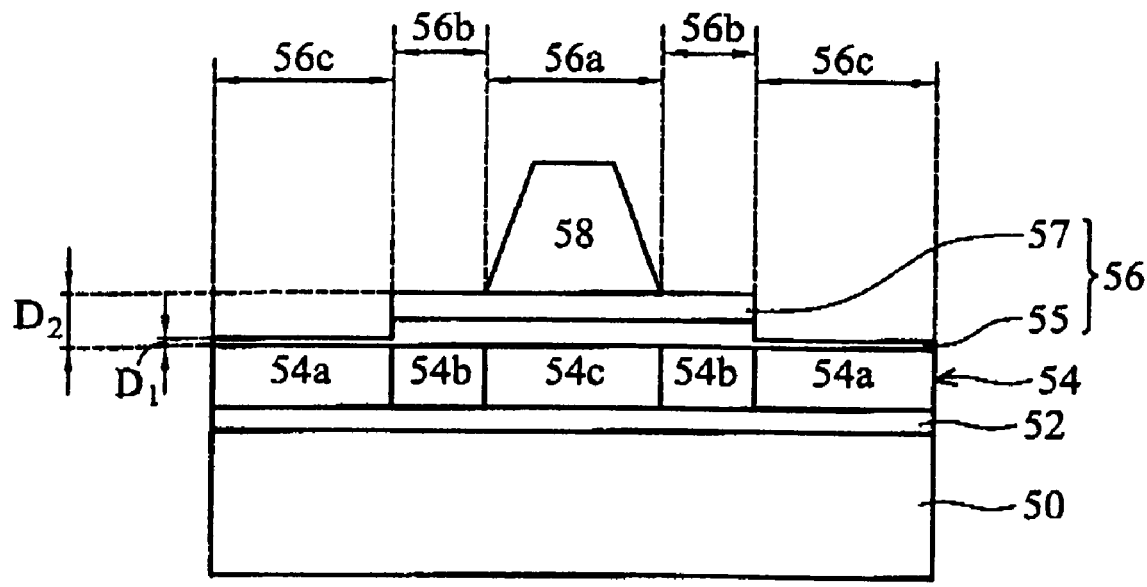

FIGS. 4A and 4B are cross-sections of a thin film transistor with a self-aligned lightly doped region according to the second embodiment of the present invention.

Elements in the second embodiment are substantially similar to that of the first embodiment, with the discussion of similar portions omitted below. The gate insulating layer 56 is composed of a first insulating layer 55 and a second insulating layer 57. Preferably, the first insulating layer 55 is a silicon oxide layer, a silicon nitride layer, a silicon-oxide-nitride layer or a combination thereof. The second insulating layer 57 may be of different or same material. Preferably, the second insulating layer 57 is a silicon oxide layer, a silicon nitride layer, a silicon-oxide-nitride layer, or a combination thereof.

The gate insulating layer 56 has a central region 56a, two extending regions 56b and two extending regions 56c. In the central region 56a, a double-layer structure composed of the first insulating layer 55 and the second insulating layer 57 covers the channel region 54c. In the shielding region 56b, a double-layer structure composed of the first insulating layer 55 and the second insulating layer 57 covers the lightly doped region 54b and is exposed laterally adjacent to the gate layer 58. In the extending region 56c, a single-layer structure composed of the first insulating layer 55 covers the source/drain region 54a. Thus, a thickness $D_1$ of the extending region 56c (the single-layer structure) is smaller than a thickness $D_2$ of the shielding region 56b (the double-layer structure).

By the combination of the first insulating layer 55 and the second insulating layer 57, the thickness $D_1$ of the extending region 56c and the thickness $D_2$ of the shielding region 56b can be well controlled to satisfy the condition: $D_1<D_2$. Preferably, the thickness $D_1$ is far smaller than the thickness $D_2$. Alternatively, the thickness $D_1$ is close to a minimum. Thus, using the thicker shielding region 56b as an ion-implantation mask for the lightly doped region 54b, and performing an ion implantation process with adequate doping energy and dosage, the lightly doped region 54b and the source/drain region 54a can be achieved at the same time. Preferably, the shielding region 56b has a lateral width of 0.1~2.0 μm, the doping energy is 10~100 KeV, the lightly doped region 54b has a doping concentration less than $5\times10^{18}$ atom/cm$^3$ serving as an LDD structure, alternatively less than $2\times10^{17}$ atom/cm$^3$ serving as an offset region, and the source/drain region has a doping concentration of $2\times10^{19}$~$2\times10^{21}$ atom/cm$^3$. Advantages in the second embodiment are substantially similar to that of the first embodiment, with the similar portions omitted below.

In FIG. 4A, in the formation of the extending region 56c, an etching process for the second insulating layer 57 is stopped on the first insulating layer 55. Comparatively, in the alternate embodiment of FIG. 4B, the first insulating layer 55 is over etched to be thinner than that in FIG. 4A. Both layers in FIGS. 4A and 4B satisfy the condition: $D_1<D_2$, and achieve the above-described advantages. In addition, the gate insulating layer 56 may be composed of three insulating layers or more than three insulating layers to achieve the same thickness difference between the extending region 56c (thickness $D_1$) and the shielding region 56b (thickness $D_2$).

Alternatively, not shown, the second insulating layer 57 may be partially etched to form the thinner region 56c.

Still alternatively, not shown, more than two layers of insulating layer may be deployed along with accompanying masking and etching process, to provide a gradually thinning region to obtain a gradual change in doping concentration outside of the gate region 56a.

Third Embodiment

FIGS. 5A to 5F are cross-sections of a fabrication method for a thin film transistor with a self-aligned lightly doped region according to the third embodiment of the present invention.

The fabrication method may be used in P-MOS TFTs or N-MOS TFT applications. According to the thin film transistor described in the first embodiment, the fabrication method for the self-aligned lightly doped region is described in the following.

Figure 5A:
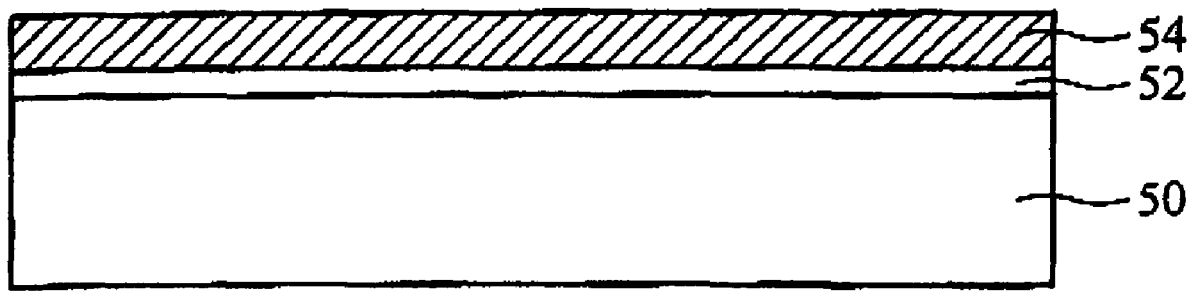
FIGS. 5A to 5F are cross-sections of a fabrication method for a thin film transistor with a self-aligned lightly doped region according to the third embodiment of the present invention.

In FIG. 5A, a substrate 50 is provided with a buffer layer 52 and an active layer 54 formed successively thereon. The substrate 50 is preferably a transparent insulating substrate, such as a glass substrate. The buffer layer 52 is preferably a dielectric layer, such as a silicon oxide layer, for improving the formation of the active layer 54 overlying the substrate 50. The active layer 54 is preferably a semiconductor layer, such as a polysilicon layer. For example, the active layer 54 is formed by a low temperature polycrystalline silicon (LTPS) process. An amorphous silicon layer is formed on a glass substrate, and then heat treatment or excimer laser annealing (ELA) is used to transform the amorphous silicon layer into a polysilicon layer.

Figure 5B:
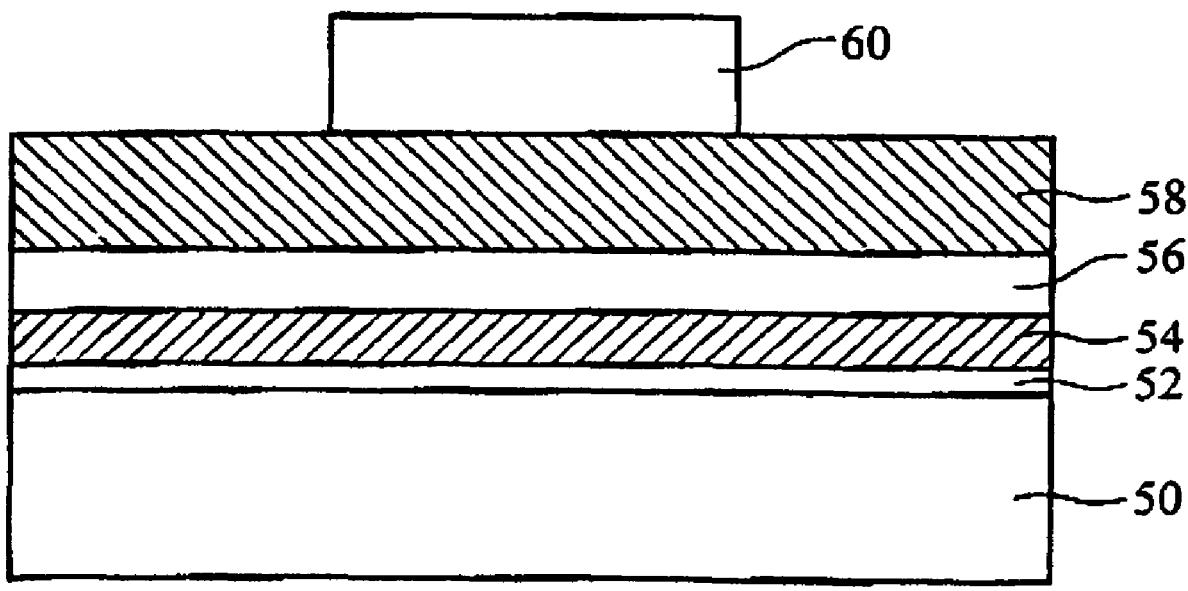

In FIG. 5B, a gate insulating layer 56 and a gate layer 58 are successively deposited on the active layer 54, and then a patterned photoresist layer 60 is formed on the gate layer 58. The gate insulating layer 56 may be a silicon oxide layer, a silicon nitride layer, a SiON layer or a combination thereof. The gate layer 58 is preferably a conductive layer, such as a metal layer or a polysilicon layer. The size and position of the patterned photoresist layer 60 correspond to that of a predetermined gate pattern.

Figure 5C:
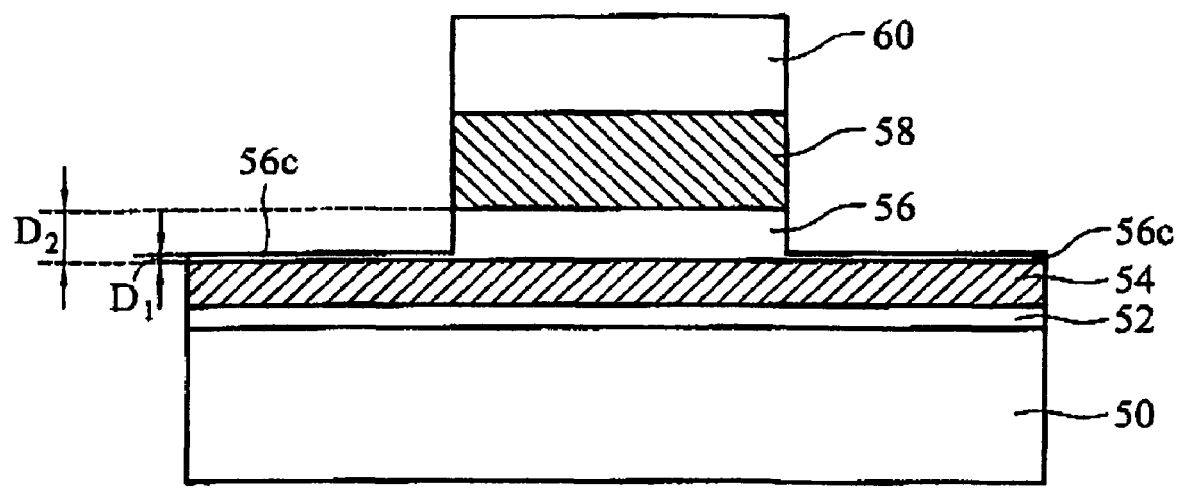

In FIG. 5C, using the patterned photoresist layer 60 as a mask, the gate layer 58 is etched to define the predetermined pattern of the gate layer 58 until the gate insulating layer 56 achieves a predetermined thickness difference. Plasma etching or reactive ion etching may be employed to modulate the etched thickness of the gate insulating layer 56 until the gate insulating layer 56 outside the gate layer 58 is retained, resulting in an extending region 56c. Also, a thickness $D_1$ of the extending region 56c and a thickness $D_2$ of gate insulating layer 56 underlying the gate layer 58 satisfy the condition: $D_1<D_2$.

Figure 5D:
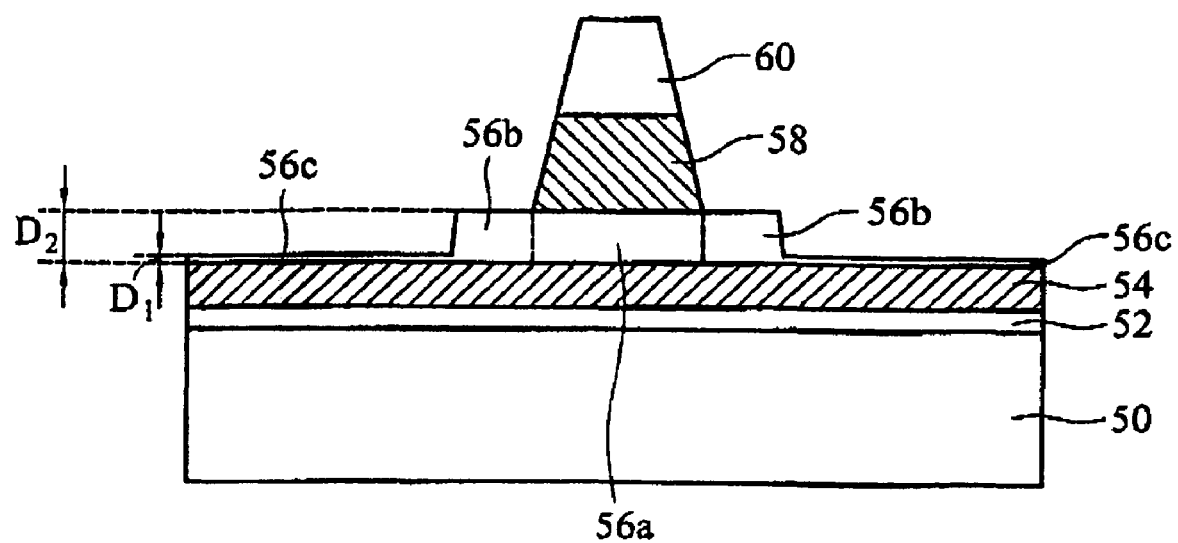

In FIG. 5D, by etching, the gate layer 58 is shaped as a trapezoid profile with an upper base shorter than a lower base, thus the gate insulating layer 56 covered by the bottom of the gate layer 58 serves as a central region 56a. Also, the gate insulating layer 56 exposed laterally adjacent to the gate layer 58 serves as a shielding region 56b. Moreover, a thickness $D_1$ of the extending region 56c and a thickness $D_2$ of shielding region 56b must satisfy the condition: $D_1<D_2$. Preferably, the etching method uses a reactive gas mixed by an oxygen-containing gas and a chlorine-containing gas, and adjusts the individual flow of the oxygen-containing gas or the chlorine-containing gas in a timely manner. For example, during the etching process for the gate layer 58, the flow of the chlorine-containing gas is gradually tuned to reach a maximum, even if chlorine-containing gas is the main gas used, resulting in a trapezoid profile of the gate layer 58. During the etching process for the gate insulating layer 56, the flow of the chlorine-containing gas is gradually tuned to reach a minimum, even if the oxygen-containing gas is the main gas used. This etching process shown in FIG. 5D may replace that shown in FIG. 5C in order to decrease process time and costs.

Figure 5E:
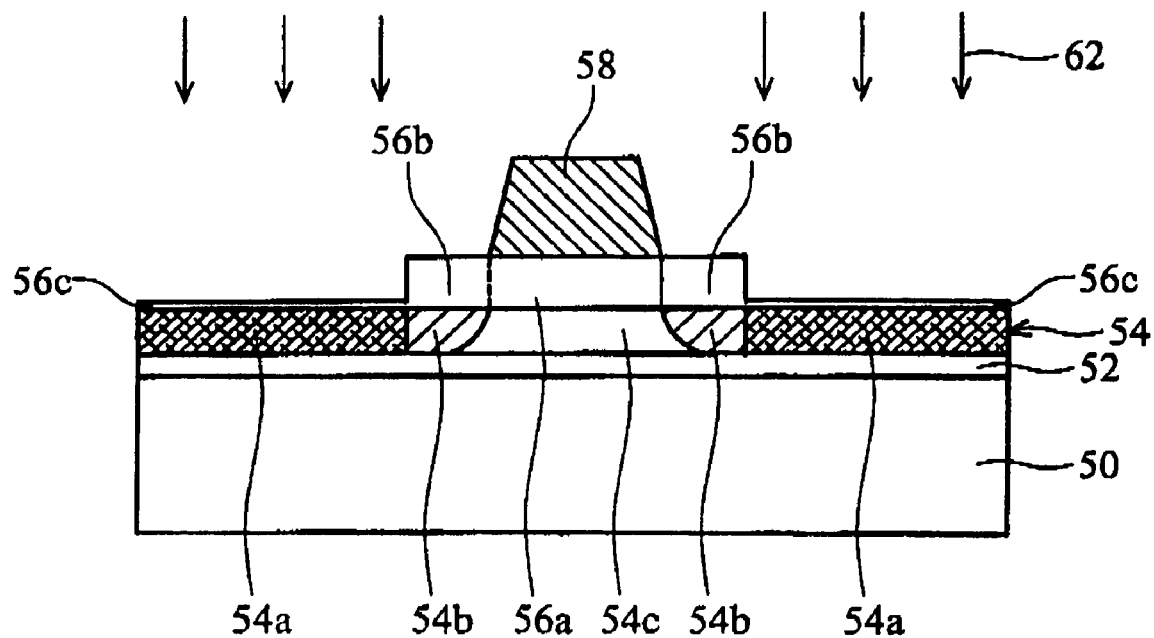

In FIG. 5E, after removing the patterned photoresist layer 60, the gate layer 58, and the shielding region 56b are used as a mask, and an ion implantation process 62 is performed to form an undoped region 54c, a lightly-doped region 54b, and a heavily-doped region 54a in the active layer 54. The lightly-doped region 54b underlying the shielding region 56b serves as an LDD structure 54b or offset region 54b. The heavily-doped region 54a underlying the extending region 56c serves as a source/drain region 54a. The undoped region 54c underlying the central region 56a serves as a channel region 54c.

In the ion implantation process 62, the lightly doped region 54b has a doping concentration less than $5\times10^{18}$ atom/cm$^3$, and the source/drain region 54a has a doping concentration of $2\times10^{19}$~$2\times10^{21}$ atom/cm$^3$. The thin film transistor is used in N-MOS TFT applications, thus the lightly doped region 54b is an N$^-$-doped region, and the source/drain region 54a is an N$^+$-doped region. Alternatively, the thin film transistor is used in P-MOS TFT applications, thus the lightly doped region 54b is a P⁻-doped region, and the source/drain region 54a is a P⁺-doped region.

Figure 5F:
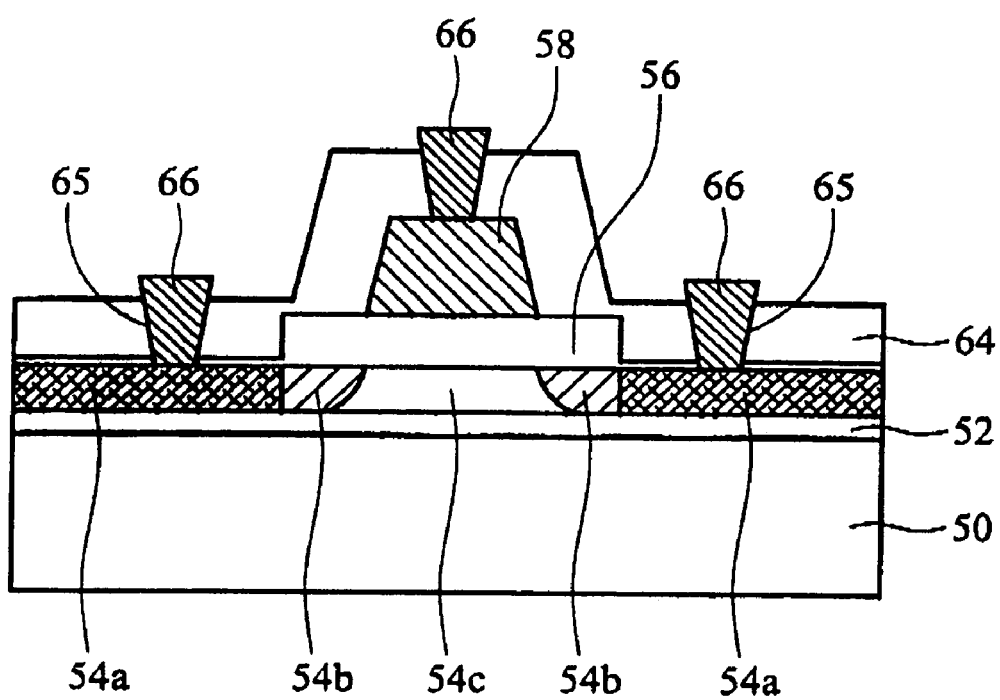

In FIG. 5F, an interconnect process for an inter-dielectric layer 64, a plurality of contact vias 65 and a plurality of interconnects 66 is performed thereon.

In addition to the advantages as described in the first embodiment, the fabrication method for the thin film transistor of the third embodiment of the present invention further has the following advantage.

The ion implantation process can be performed simultaneously in the P-MOS region and the N-MOS region for different degree doped regions to modulate electric characteristics, thus further simplifying procedure, decreasing process costs, increasing product yield and increasing production rate.

Fourth Embodiment

FIGS. 6A to 6D are cross-sections of a fabrication method for a thin film transistor with a self-aligned lightly doped region according to the fourth embodiment of the present invention.

The fabrication method may be used in P-MOS TFT or N-MOS TFT applications. According to the thin film transistor structure described in the second embodiment, the fabrication method for the self-aligned lightly doped region is described in the following. Elements and steps in the fourth embodiment are substantially similar to that of the third embodiment, with description of the similar portions omitted below.

Figure 6A:
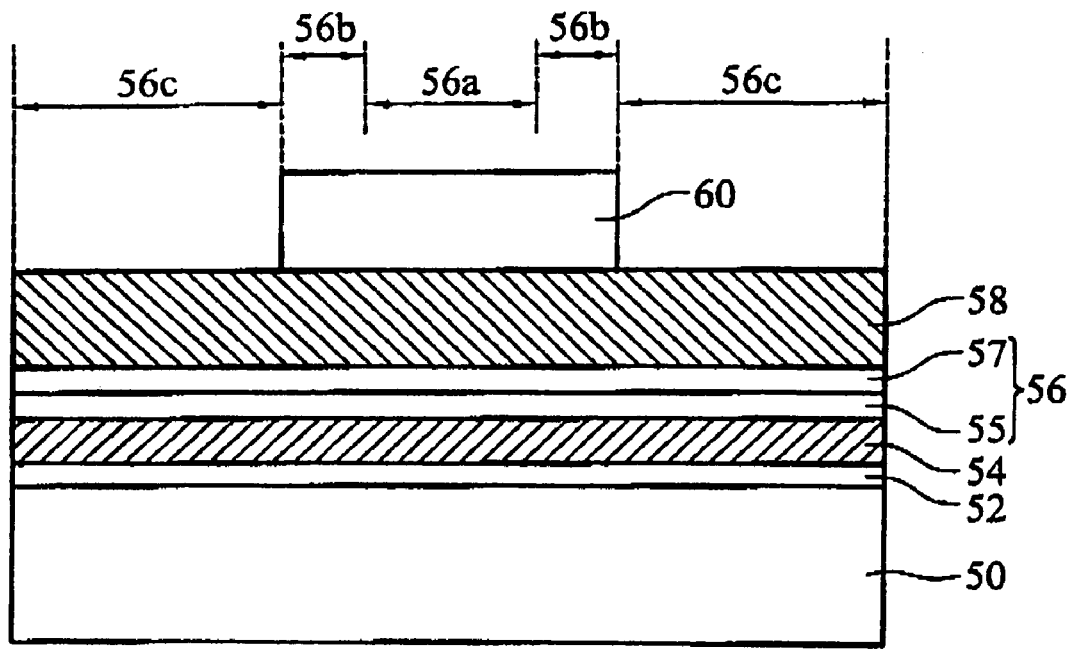
FIGS. 6A to 6D are cross-sections of a fabrication method for a thin film transistor with a self-aligned lightly doped region according to the fourth embodiment of the present invention.

In FIG. 6A, a substrate 50 is provided with a buffer layer 52, an active layer 54, a first insulating layer 55, a second insulating layer 57, a gate layer 58 and a patterned photoresist layer 60. Preferably, the substrate 50 is a glass substrate, the buffer layer 52 is silicon oxide layer, and the active layer 54 is a polysilicon layer. The first insulating layer 55 may be a silicon oxide layer, a silicon nitride layer, a SiON layer or a combination thereof. The second insulating layer 57 may be a silicon oxide layer, a silicon nitride layer, a SiON layer or a combination thereof. The gate layer 58 may be a conductive layer, a metal layer or a polysilicon layer. The size and position of the patterned photoresist layer 60 correspond to that of a predetermined gate pattern.

The combination of the first insulating layer 55 and the second insulating layer 57 serves as a gate insulating layer 56. Additionally, the gate insulating layer 56 has a central region 56a, two shielding regions 56b, and two extending regions 56c.

Figure 6B:
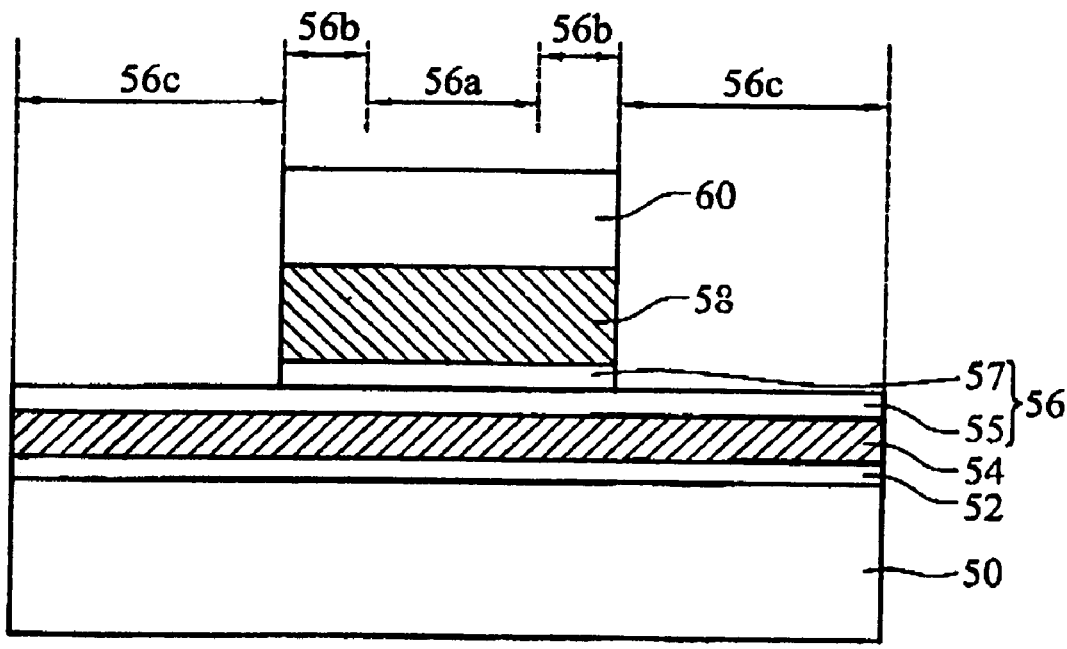

In FIG. 6B, using the patterned photoresist layer 60 as a mask, the gate layer 58 is etched to define the predetermined pattern of the gate layer 58 until a part of the gate insulating layer 56 is etched. Plasma etching or reactive ion etching may be employed to modulate the thicknesses of the second insulating layer 57 and the first insulating layer 55. Preferably, the second insulating layer 57 is removed so as to retrain the first insulating layer 55 within the extending region 56c. Thus, the extending region 56c is a single-layer structure composed of the first insulating layer 55, and the shielding region 56b is a double-layer structure composed of the first insulating layer 55 and the second insulating layer 57. The extending region 56c is thinner than the shielding region 56b.

Figure 6C:
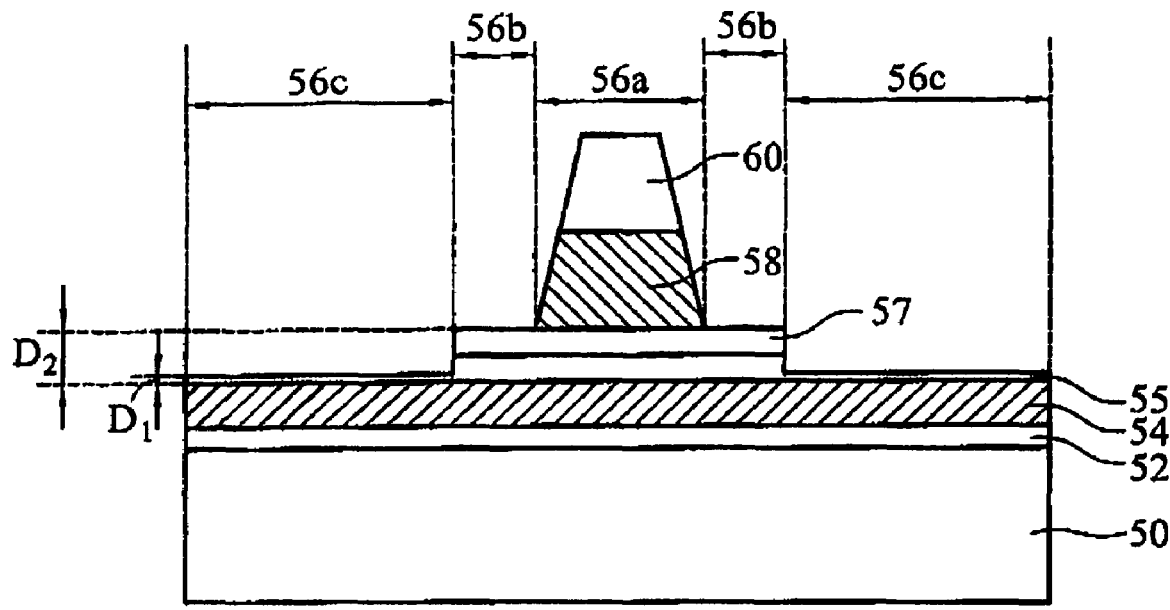

In FIG. 6C, using an enforceable etching method, the gate layer 58 is shaped as a trapezoid profile with an upper base shorter than a lower base. Thus, the central region 56a, a double-layer structure composed of the first insulating layer 55 and the second insulating layer 57, is covered by the bottom of the gate layer 58. The shielding region 56b is exposed laterally adjacent to the gate layer 58. The extending region 56c corresponds to a predetermined source/drain region. Also, depending on product requirements, the first insulating layer 55 can be over etched, and a thickness $D_1$ of the extending region 56c and a thickness $D_2$ of shielding region 56b must satisfy the condition: $D_1 < D_2$. Moreover, this step shown in FIG. 6C may replace that shown in FIG. 6B in order to decrease process time and cost.

Figure 6D:
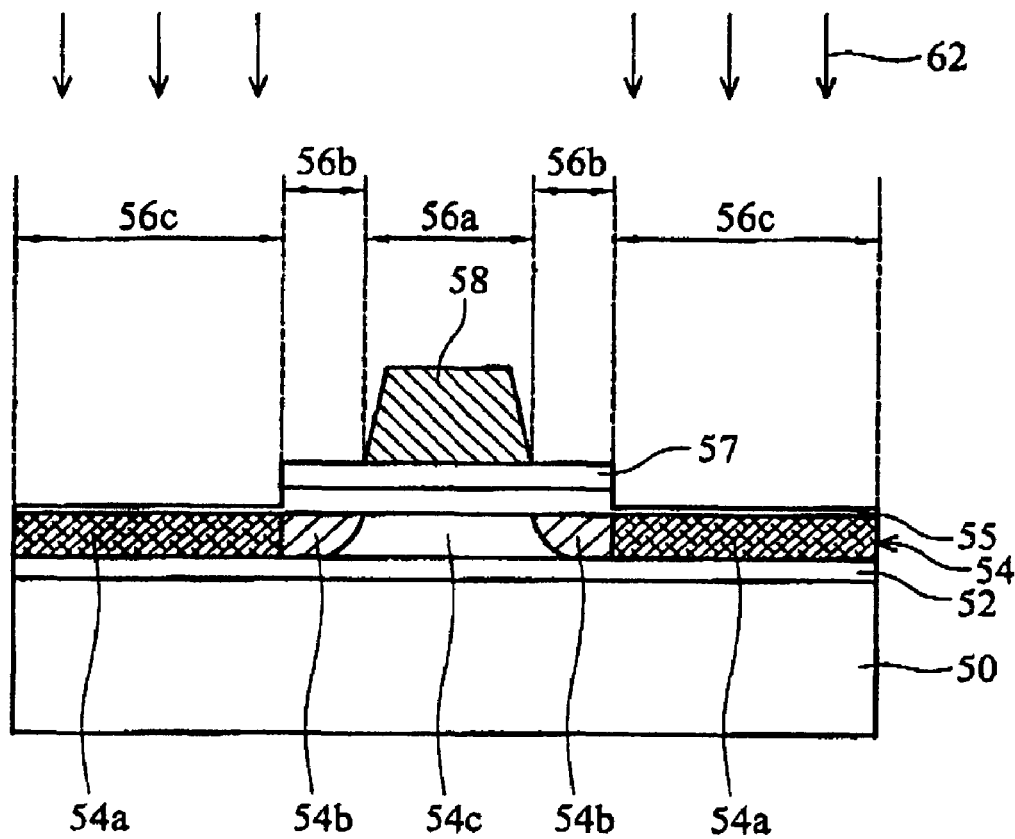

In FIG. 6D, after removing the patterned photoresist layer 60, the gate layer 58 and the shielding region 56b are used as a mask, and an ion implantation process 62 forms an undoped region 54c, a lightly-doped region 54b, and a heavily-doped region 54a in the active layer 54. The lightly-doped region 54b underlying the shielding region 56b serves as a lightly doped region 54b. The heavily-doped region 54a underlying the extending region 56c serves as a source/drain region 54a. The undoped region 54c underlying the central region 56a serves as a channel region 54c. Preferably, the lightly doped region 54b has a doping concentration less than $5 \times 10^{18}$ atom/cm³ serving as an LDD structure, alternatively less than $2 \times 10^{17}$ atom/cm³ serving as an offset region, and the source/drain region has a doping concentration of $2 \times 10^9 \sim 2 \times 10^{21}$ atom/cm³. Thereafter, an interconnect process is performed thereon.

Advantages in the fourth embodiment are substantially similar to that of the third embodiment, with the similar portions omitted below. In addition, the gate insulating layer 56 may constitute three or more insulating layers to achieve the same thickness difference between the extending region 56c (thickness $D_1$) and the shielding region 56b (thickness $D_2$)

Fifth Embodiment

Figure 7:
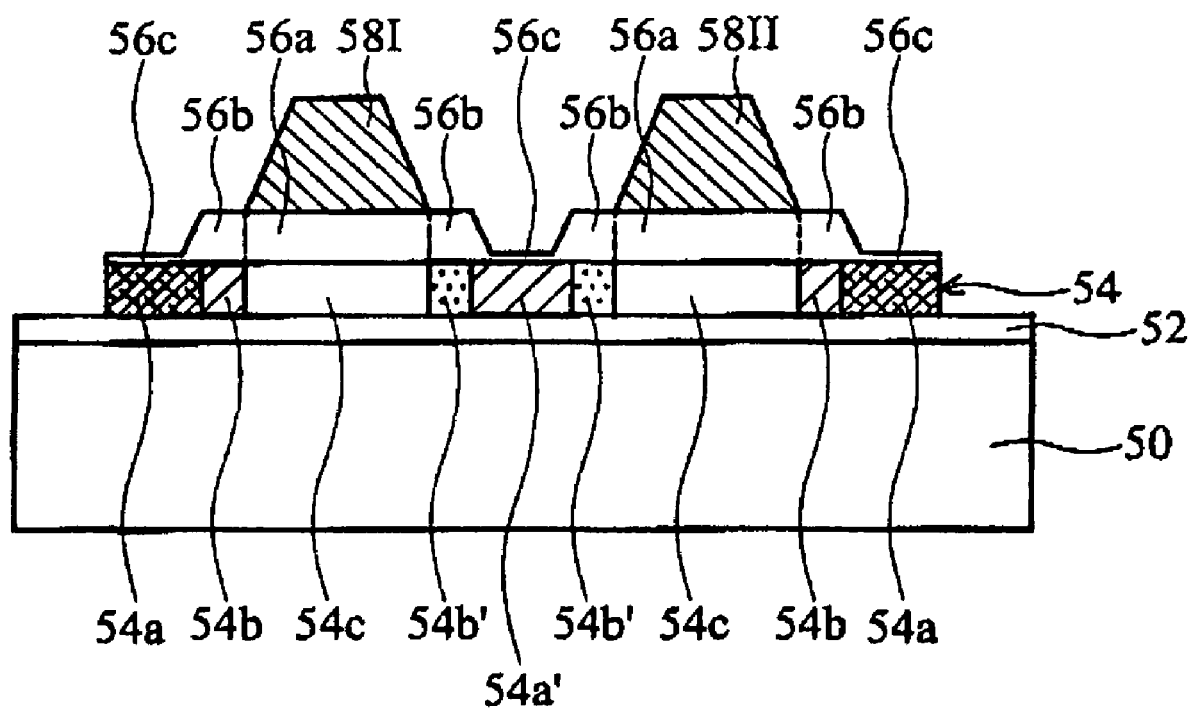
FIG. 7 is a cross-section of a self-aligned lightly doped region having a dual-gate structure according to the fifth embodiment of the present invention.

FIG. 7 is a cross-section of a lightly doped region TFT having a dual-gate structure according to this embodiment. The shielding region 56b has a relatively thicker section that covers the region of the semiconductor layer to be lightly doped, and a relatively thinner extending region that covers the region of the semiconductor layer to be heavily doped. This may be accomplished by modifying the etching step in FIGS. 5C to 5E, where the gate insulating layer 56 not covered by the gates 58I and 58II are etched to reduce its thickness (corresponding to regions 54a and 54a') to less than the thickness of the gate insulating layer above regions 54b and 54b'. Alternatively, additional or separate etching steps may be involved to form a gate insulating layer that includes a thicker region and a thinner region. As a result, each gate insulating layer comprises an extended region 56c extending laterally away from the shielding region 56b and covering the region 54a. The extended region 56c is thinner than the shielding region 56b to protect the underlying polysilicon layer without affecting concentration of the lightly doped region and the source region.

After doping step in FIG. 7, a dope shielding mask of photoresist is applied between the gates 56 and the entire structure is subject to further doping.

Thus, gate insulating layers having the extended regions 56c can achieve the advantages described in the second embodiment.

Each extended region 56c and each shielding region 56b may be fabricated using the same material. Alternatively, the shielding region 56b comprises a first insulating layer and a second insulating layer, and the extended region 56c comprises the first insulating layer. The first insulating layer may be made of silicon oxide, silicon nitride, silicon-oxidenitride, or a combination thereof. The second insulating layer may be made of silicon oxide, silicon nitride, silicon-oxide-nitride, or a combination thereof. In addition, the first gate insulating layer may comprise three or more insulating layers to achieve the same thickness difference between the extended region 56c and the shielding region 56b.

FIG. 7 is a simplified basic lightly doped region TFT having a multi-gate structure configuration. Further steps to complete the lightly doped region TFT may include steps to form, for example, electrodes, metalization, interconnect structures, passivation layers, etc. known in the art.

Sixth Embodiment

FIGS. 8A to 8D are cross-sections of a fabrication method for a TFT having a dual-gate structure according to this embodiment.

Figure 8A:
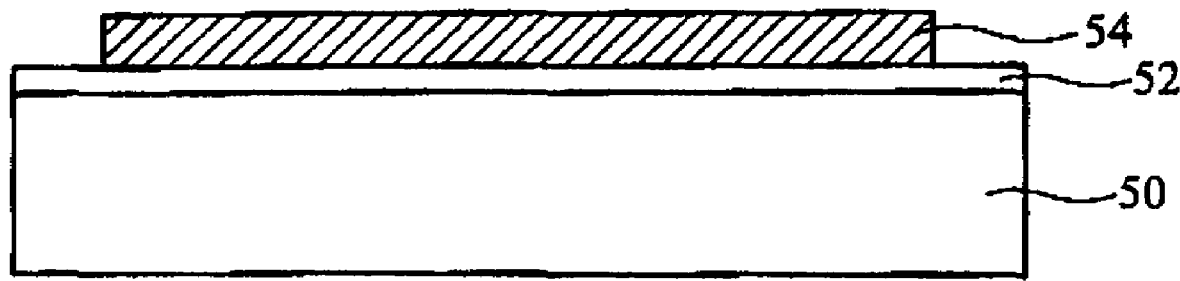
FIGS. 8A to 8E are cross-sections of a fabrication method for a TFT having a dual-gate structure according to the sixth embodiment of the present invention.

In FIG. 8A, a substrate 50 is provided with a buffer layer 52 and a semiconductor layer 54 successively formed thereon. The substrate 50 is a transparent insulating substrate, such as a glass substrate. The buffer layer 52 is a dielectric layer, such as a silicon oxide layer, for improving the formation of the semiconductor layer 54 on the substrate 50. The semiconductor layer 54 is a polysilicon layer. In order to adjust threshold voltage of transistor, $B^+$ or $P^+$ ion implantation process may be performed thereon.

Figure 8B:
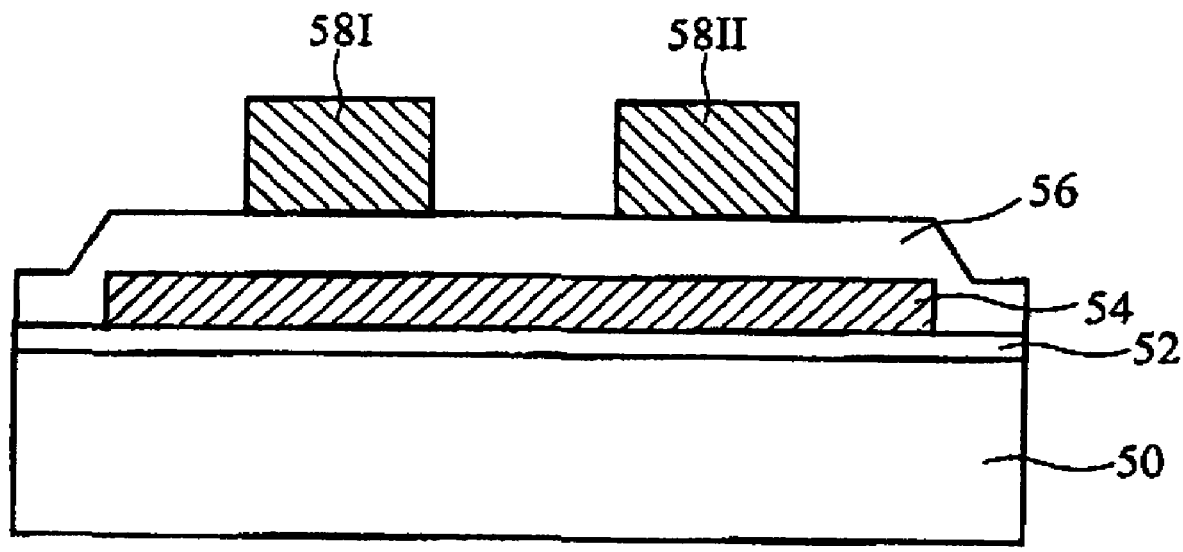

In FIG. 8B, an insulating layer 56 and a conductive layer 58 are successively deposited on the semiconductor layer 54. The insulating layer 56 may be made of silicon oxide, silicon nitride, silicon-oxide-nitride or a combination thereof. The conductive layer 58 (not shown) may be a metal layer or a polysilicon layer. Dry etching with a patterned photoresist mask then forms the conductive layer 58 as a first gate layer 58I and a second gate layer 58II.

Figure 8C:
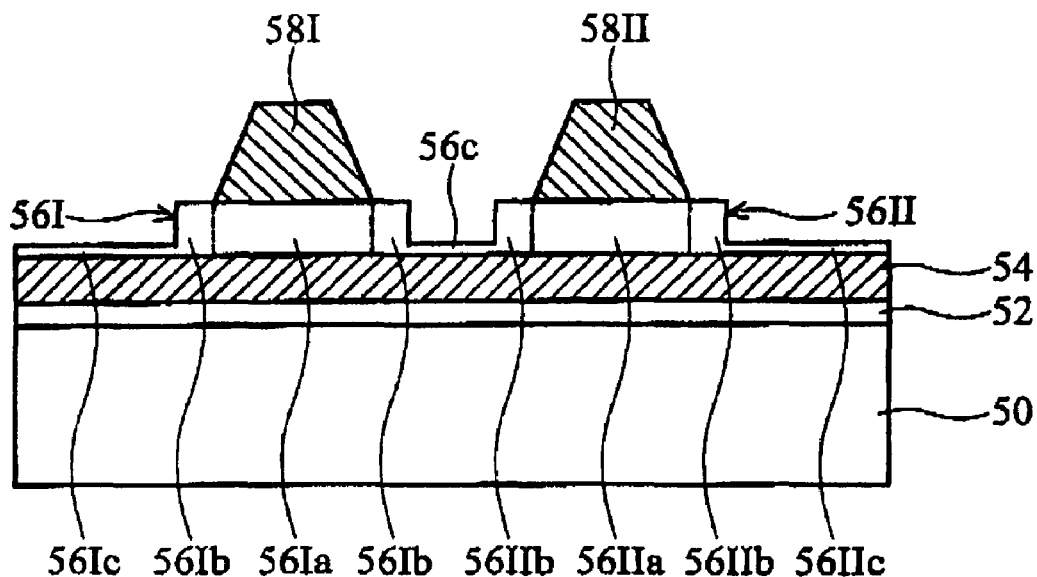

In FIG. 8C, plasma etching or reactive ion etching is employed with a reactive gas mixture of an oxygen-containing gas and a chlorine-containing gas, whereby the gate layers 58I and 58II of a trapezoid profile and two gate insulating layers 56I and 56II are completed by adjusting the individual flow of the oxygen-containing gas or the chlorine-containing gas in a timely manner. For example, during the etching process for the gate layers 58I and 58II, the flow of the chlorine-containing gas is gradually tuned to a maximum, even if chlorine-containing gas is the main gas used. During the etching process for the insulating layer 56, the flow of the oxygen-containing gas is gradually increased to a maximum, such that a part of the patterned photoresist mask is removed and the gate layers 58I and 58II exposed again by the patterned photoresist mask is etched simultaneously. The photoresist mask is then removed.

By modifying the etching step in FIGS. 5C to 5E, or alternatively, involving additional or separate etching steps, the gate insulating layer 56 not covered by the gates 58I and 58II are etched and formed to include thicker regions and thinner regions. As a result, the first gate insulating layer 56I comprises a central region 56Ia, two shielding regions 56Ib, and two extending regions 56Ic and 56c and the second gate insulating layer 56II comprises a central region 56IIa, two shielding regions 56IIb, and two extending regions 56IIc and 56c. The central regions 56Ia and 56IIa are covered by the bottom of the gate layers 58I and 58II. The two shielding regions 56Ib extend laterally away from the central region 56Ia, respectively, and the two shielding regions 56IIb extend laterally away from the central region 56IIa, respectively, without being covered by the gate layers 58I and 58II. The extending regions 56Ic and 56c extend laterally away from the shielding regions 56Ib, respectively, with one of shielding regions 56Ib between the regions 56Ia and 56Ic, another shielding region 56Ib between the regions 56Ia and 56c. In the same way, one of shielding regions 56IIb is between the regions 56IIa and 56IIc, and another shielding region 56IIb is between the regions 56IIa and 56c. The extending region 56c of the first gate insulating layer and the extending region 56c of the second gate insulating layer are joined together. The extending regions 56Ic and 56IIc cover a predetermined source/drain region, respectively. The thickness of the shielding region is larger than that of the extending region. The shielding region 56Ib has a lateral length of 0.1 µm~2.0 µm. Depending on requirements for circuit designs, the size and symmetry of the lateral lengths may be adequately modified.

Figure 8D:
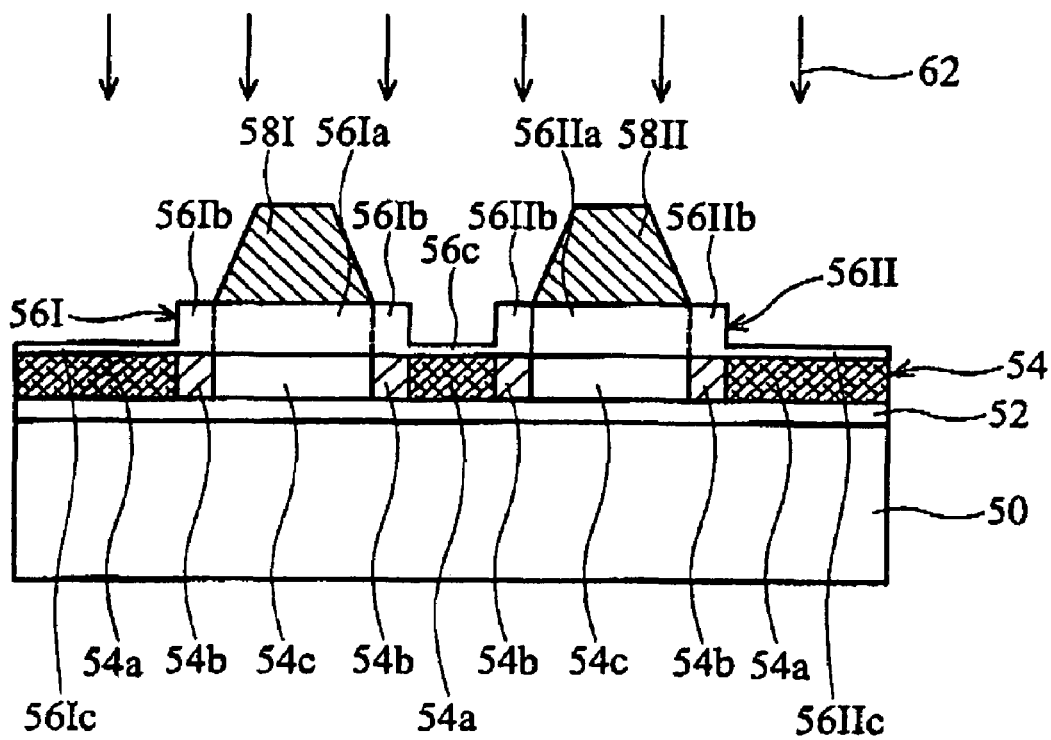

In FIG. 8D, a lightly doped ion implantation process 62 is employed, and the gate layers 58I and 58II and the shielding regions are used as masks, such that a plurality of regions 54a, 54b, and 54c with various doping concentrations are formed in the active layer 54. The regions 54c are undoped, correspondingly located underlying the central regions 56Ia and 56IIa, respectively. The regions 54b are lightly doped regions, correspondingly located underlying the shielding regions 56Ib and 56IIb, respectively. The regions 54a are doped regions, correspondingly located underlying the extending regions 56Ic, 56IIc, and 56c, respectively, laterally adjacent to the shielding regions 54b of the first gate insulating layer 54. One region 54a is disposed between the shielding regions 54b and may have a different doping concentration with the regions 54a, as desired. By adjusting accelerated voltage and dosage of the lightly doped ion implantation process 62, the doping concentrations of the lightly doped regions 54b can be modified to serve as lightly doped drain structures or offset regions and may each have a different doping concentration, as desired.

Figure 8E:
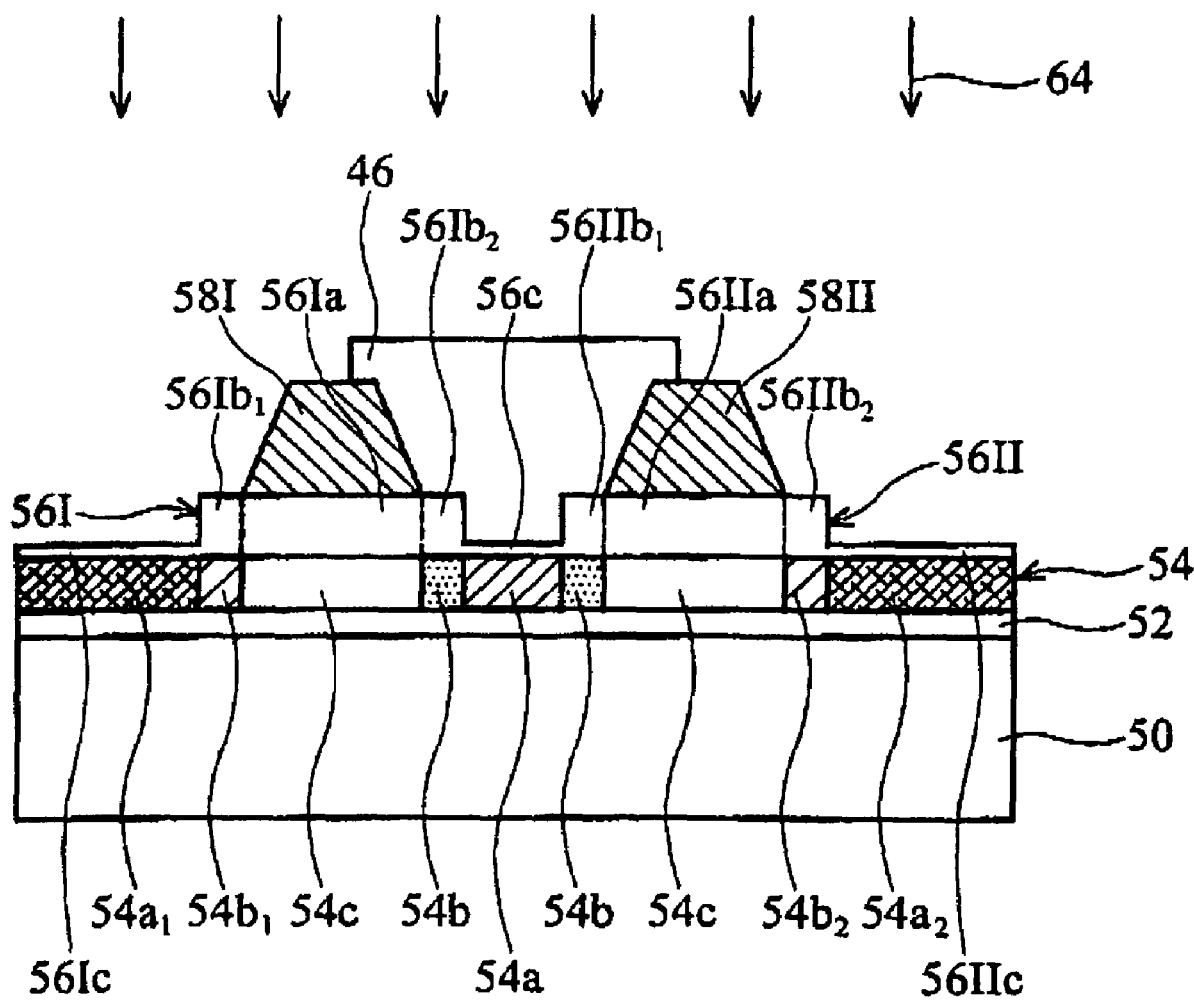

In FIG. 8E, after a lightly doped ion implantation process 62 is employed, a photoresist layer 46 is formed to cover the shielding region $56Ib_2$ of the first gate insulating layer 56I, the shielding region $56IIb_1$ of the second gate insulating layer 56II, and the common extending region 56c in the space between the shielding regions $56Ib_2$ and $56IIb_1$. Finally, a heavily-doped ion implantation process 64 is performed, and the photoresist layer 46, the gate layers 58I and 58II, and the shielding regions $56Ib_1$ and $56IIb_2$ are used as masks, such that the doping concentrations of the regions $54b1$ and $54b2$ are increased to become $N^-$ regions and the doping concentrations of the regions $54a1$ and $54a2$ are increased to become $N^+$ regions.

Accordingly, the regions $54a_1$ and $54a_2$ are $N^+$ regions, serving as a source region and a drain region respectively. The region $54b_1$ and the region $54b_2$ are $N^-$ regions, serving as two LDD structures or offset regions. The regions 54b are $N^{--}$ regions, serving as another two LDD structures or offset regions, located between the two gate layers 58I and 58II. The region 54a is an $N^-$ region, serving as common source/drain region. The regions 54c are undoped, serving as two channel regions of the dual-gate structure. Preferably, the doping concentration for the regions $54a_1$, and $54a_2$ is $2\times10^{19}$~$2\times10^{21}$ atom/cm$^3$, for the regions $54b_1$, $54b_2$ and $54a$, less than $5\times10^{18}$ atom/cm$^3$, and for the regions $54b$, less than $2\times10^{17}$ atom/cm$^3$.

The TFT may be used in an N-MOS TFT, such that the lightly doped regions are $N^-$ regions, and heavily doped regions are $N^+$ regions. Alternatively, the LDD TFT is used in a P-MOS TFT, such that the lightly doped regions are $P^-$ regions, and heavily doped regions are $P^+$ regions. Subsequent interconnect process including formation of inter-dielectric layers, contact holes and interconnects on the thin film transistor is omitted herein.

The TFT and the fabrication method thereof have the following advantages.

First, two symmetrical LDD regions outside the two gate layers 58I and 58II and two symmetrical Lightly doped regions between the two gate layers 58I and 58II are formed simultaneously, thus effectively reducing current leakage.

Second, the ion implantation process uses the shielding regions as masks, thus completing self-aligned lightly doped regions and source/-drain regions simultaneously.

Third, by adjusting parameters of the etching process, the lateral lengths of the shielding regions can be accurately controlled, thus ensuring proper positioning of the lightly doped regions and electric performance of the TFT.

Fourth, since an extra photomask or a spacer structure for defining the Lightly doped regions are not used, shifting of the lightly doped regions due to photo misalignment in exposure is prevented, further improving accuracy in positioning the lightly doped regions.

Fifth, the heavily doped ion implantation process 64 uses the photoresist layer 46 as a mask without a high-accuracy pattern, thus simplifying a photolithography process for the photoresist layer 46.

FIG. 8E is a simplified basic TFT having a multi-gate structure configuration. Further steps to complete the TFT may include steps to form, for example, electrodes, metalization, interconnect structures, passivation layers, etc. known in the art.

Figure 9:
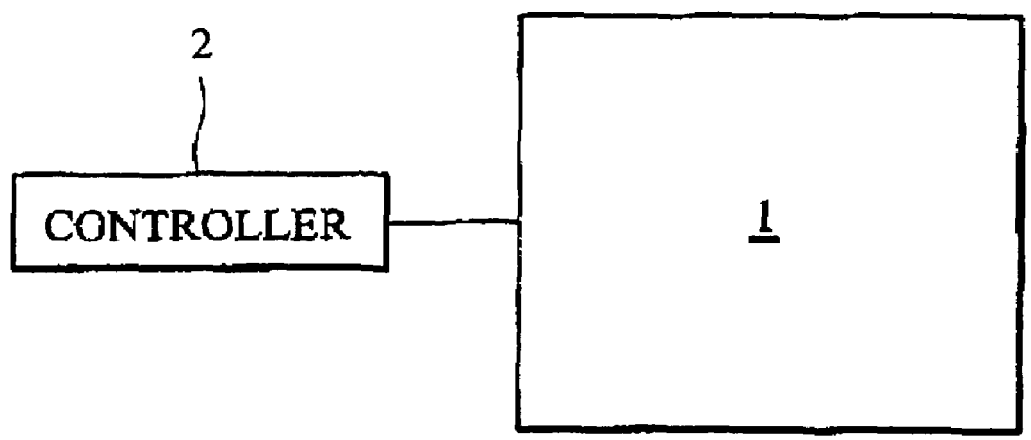
FIG. 9 is a schematic diagram of a display device comprising the LDD TFT in accordance with one embodiment of the present invention.

FIG. 9 is a schematic diagram of a display device 3 comprising the TFT in accordance with one embodiment of the present invention. The display panel 1 can be couple to a controller 2, forming a display device 3 as shown in FIG. 9. The controller 3 can comprise a source and a gate driving circuits (not shown) to control the display panel 1 to render image in accordance with an input.

Figure 10:
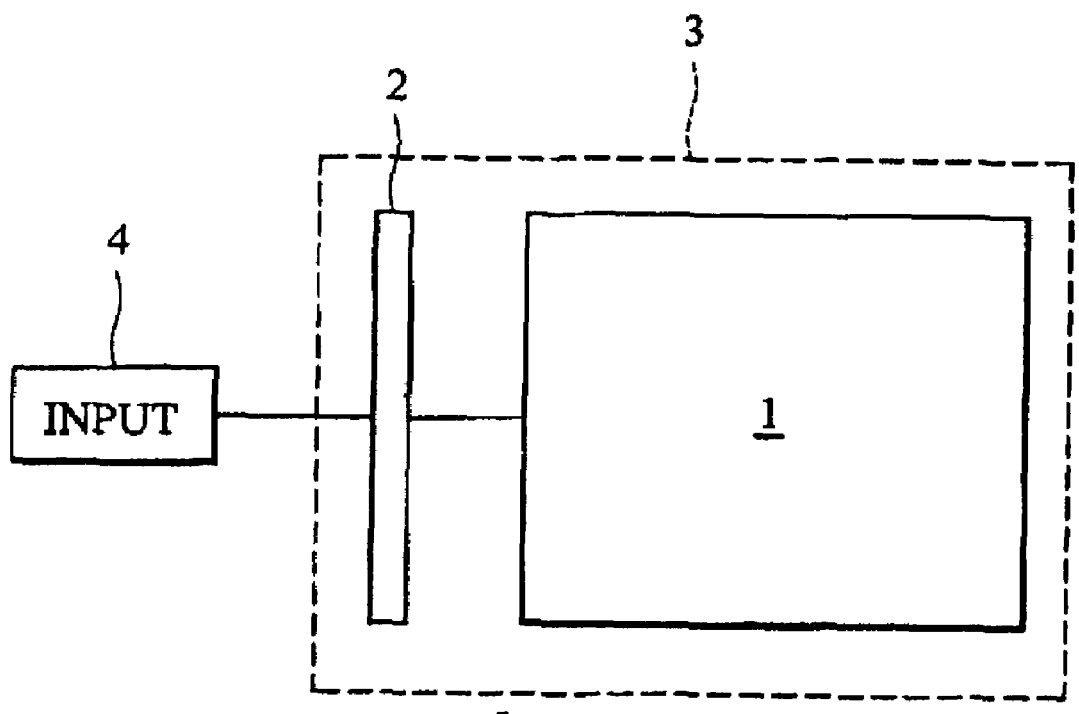
FIG. 10 is a schematic diagram of an electronic device comprising the display device in accordance with the present invention.

FIG. 10 is a schematic diagram of an electronic device 5, incorporating a display comprising the TFT in accordance with one embodiment of the present invention. An input device 4 is coupled to the controller 2 of the display device 3 shown in FIG. 9 can include a processor or the like to input data to the controller 2 to render an image. The electronic device 5 may be a portable device such as a PDA, notebook computer, tablet computer, cellular phone, or a desktop computer.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of forming a semiconductor device, comprising the steps of:

providing a semiconductor layer including a first region and a second region;

providing a first masking layer over the semiconductor layer, said first masking layer comprising a material that provides a permeable barrier to a dopant, wherein the first masking layer comprises a first thickness portion over the first region of the semiconductor layer and a second thickness portion over the second region of the semiconductor layer, wherein the first masking layer comprises first and second layers, and wherein the first region of the semiconductor layer comprises the first and second layers, and the second region of the semiconductor layer comprises only the first layer;

providing a second masking layer that overlies the first thickness portion of the first masking layer and exposes the second thickness portion of the first masking layer; and exposing the first region and second region of the semiconductor layer covered by the first masking layer to the dopant, wherein the first region is lightly doped with the dopant in comparison to the second region.

2. The method as in claim 1, wherein the first thickness region is disposed on and aligned with the first region of the semiconductor layer.

3. The method as in claim 1, wherein the first thickness region and the second thickness region are fanned from a same layer of material.

4. The method as in claim 1, further comprising the step of prior to exposing to the dopant, providing a third masking layer over a portion of the first thickness region of the first masking layer, corresponding to a third region of the semiconductor layer, said third masking layer is impermeable to the dopant, wherein the third region is not doped when the second masking layer is exposed to dopant.

5. The method as in claim 4, wherein the semiconductor device is a TFT, and wherein the first region of the semiconductor corresponds to a lightly doped region of the TFT, the second region of the semiconductor corresponds to a heavily doped source/drain structure of the TFT, and the third region of the semiconductor corresponds to a channel of the TFT.

6. The method as in claim 5, wherein the first masking layer comprises a gate insulating layer of the TFT.

7. The method as in claim 6, wherein the third masking layer comprises a gate layer of the TFT.

8. The method as in claim 1, wherein the second thickness region is relatively thinner than the first thickness region.

9. The method as in claim 8, wherein the first masking layer is etched to form the second thickness region.

10. The method as in claim 9, wherein the first masking layer is etched using the second masking layer as an etching mask.

11. The method as in claim 1, wherein the first masking layer comprises first and second layers, wherein the first thickness portion comprises the first and second layers, and the second thickness portion comprises only the first layer.

12. The method as in claim 11, wherein the second layer is etched to form the second thickness region.

13. A fabrication method for a thin film transistor, comprising:

providing a substrate;

forming an active layer overlying the substrate;

forming a first gate insulating layer overlying the active layer, in which the gate insulating layer comprises a central region, a shielding region and an extending region, wherein the shielding region is disposed between the central region and the extending region, wherein the first gate insulating layer comprises first and second layers, and wherein the central region and the shielding region comprises the first and second layers, and the extending region comprises only the first layer;

forming a second gate insulating layer overlying the central region and the shielding region of the first insulating layer;

forming a gate layer overlying the second gate insulating layer, in which the gate layer overlies the central region and exposes the shielding region and the extending region; and doping a first doped region under the shielding region and a second doped region under the extending region, wherein first doped region is lightly doped compared to the second doped region.

14. The fabrication method as in claim 13, wherein relative thickness of the shielding region is larger than the extending region.

15. The fabrication method as in claim 14, wherein the method of forming the first gate insulating layer comprises:
  forming the first layer overlying the active layer;
  forming the second layer overlying the first layer; and
  etching to remove the second layer from to extending region, in which the first layer is retained in the extending region;
  wherein, the shielding region comprises the first layer and the second layer; and
  wherein, the extending region comprises the first layer.

16. The fabrication method for a thin film transistor as claimed in claim 13, wherein doping concentration of the first doped region is less than $2 \times 10^{17}$ atom/cm$^3$, and doping concentration of the second doped region is $2 \times 10^{19}$, $\sim 10^{21}$ atom/cm$^3$.

17. The fabrication method for a thin film transistor as claimed in claim 13, wherein doping concentration of the first doped region is less than $5 \times 10^{18}$ atom/cm$^3$, and doping concentration of the second doped region is $2 \times 10^{19} \sim 2 \times 10^{21}$ atom/cm$^3$.

18. A fabrication method for a thin film transistor having a multi-gate structure, comprising:
  providing a substrate;
  forming an active layer overlying the substrate;
  forming a first gate insulating layer and a second insulating layer overlying the active layer, in which the first gate insulating layer comprises a first central region, two first shielding regions, and two first extending regions, the first shielding region is disposed between the first central region and the first extending region, the second gate insulating layer comprises a second central region, two second shielding regions, two second extending regions, and the second shielding region is disposed between the second central region and the second extending region, and one of the two first extending regions and one of the two second extending regions are adjacent to be a common extending region;

forming a first gate layer and a second gate layer overlying the first gate insulating layer and the second gate insulating layer respectively, in which the first gate layer covers the first central region and exposes the first shielding regions and the first extending regions, and the second gate layer covers the second central region and exposes the second shielding regions and the second extending regions;

doping to form three first heavily doped regions in the active layer underlying the extending regions, four first lightly doped regions in the active layer underlying the shielding regions, and two undoped regions in the active layer underlying the central regions;

masking part of the first gate layer of the second gate layer, and two shielding regions common extending region between the first the second gate layers and expose the other two shielding regions and the other two extending regions; and further doping the heavily doped regions in the active layer underlying the two exposed extending region and two second lightly doped regions in the active layer underlying two exposed shielding regions.

* * * * *

UNITED STATES PATENT AND TRADEMARK OFFICE
CERTIFICATE OF CORRECTION

PATENT NO. : 7,388,265 B2  Page 1 of 1
APPLICATION NO. : 11/598844
DATED : June 17, 2007
INVENTOR(S) : Chang et al.

It is certified that error appears in the above-identified patent and that said Letters Patent is hereby corrected as shown below:

On the Title Page Item (73):

"TFO Displays Corp." should read --TPO Displays Corp.--.

Signed and Sealed this

Thirtieth Day of September, 2008

JON W. DUDAS
*Director of the United States Patent and Trademark Office*

UNITED STATES PATENT AND TRADEMARK OFFICE
CERTIFICATE OF CORRECTION

PATENT NO. : 7,388,265 B2 Page 1 of 1
APPLICATION NO. : 11/598844
DATED : June 17, 2008
INVENTOR(S) : Chang et al.

It is certified that error appears in the above-identified patent and that said Letters Patent is hereby corrected as shown below:

On the Title Page Item (73):

"TFO Displays Corp." should read --TPO Displays Corp.--.

This certificate supersedes the Certificate of Correction issued September 30, 2008.

Signed and Sealed this

Twenty-first Day of October, 2008

JON W. DUDAS
*Director of the United States Patent and Trademark Office*